US006348836B2

(12) United States Patent
Delano

(10) Patent No.: US 6,348,836 B2
(45) Date of Patent: Feb. 19, 2002

(54) DUAL INDEPENDENTLY CLOCKED ANALOG-TO-DIGITAL CONVERSION FOR A DIGITAL POWER AMPLIFIER

(75) Inventor: Cary L. Delano, Los Altos, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/796,845

(22) Filed: Feb. 28, 2001

Related U.S. Application Data

(60) Provisional application No. 60/186,831, filed on Mar. 3, 2000.

(51) Int. Cl.[7] .................................................. H03F 3/38

(52) U.S. Cl. ...................... 330/10; 330/207 A; 375/238

(58) Field of Search ............................... 330/10, 124 R, 330/207 A, 251; 375/238

(56) References Cited

U.S. PATENT DOCUMENTS 4,326,170 A * 4/1982 Levy ........................... 330/10
4,667,144 A * 5/1987 Jones et al. ................. 323/271
4,949,048 A * 8/1990 Tokumo et al. ............... 330/10
5,023,566 A 6/1991 El-Hamamsy et al. ...... 330/251
5,479,337 A 12/1995 Voigt .......................... 363/131
5,777,512 A 7/1998 Tripathi et al. ......... 330/207 A
5,781,067 A * 7/1998 Tota ............................ 330/10
6,130,910 A * 10/2000 Anderson et al. ........... 375/238

OTHER PUBLICATIONS

Karsten Nielson, *"High–Fidelity PWM–Based Amplifier Concept For Active Loudspeaker Systems With Very Low Energy Consumption"*, J. Audio Eng. Soc., vol. 45 No. 7/8, Jul./Aug. 1997, pp. 555–570.

* cited by examiner

*Primary Examiner*—Robert Pascal
*Assistant Examiner*—Henry Choe
(74) *Attorney, Agent, or Firm*—Beyer Weaver & Thomas, LLP

(57) ABSTRACT

An electronic device is described which includes at least two sampling circuits, and at least two switching stages configured in parallel. Each of the switching stages is coupled to one of the sampling circuits. The sampling circuits and the switching stages enable the electronic device to exhibit more than two quantization states. The electronic device further includes clock generation circuitry for generating independent clock signals for each of the sampling circuits.

24 Claims, 3 Drawing Sheets

DUAL INDEPENDENTLY CLOCKED ANALOG-TO-DIGITAL CONVERSION FOR A DIGITAL POWER AMPLIFIER

RELATED APPLICATION DATA

The present application claims priority from U.S. Provisional Patent Application No. 60/186,831 for DUAL INDEPENDENTLY CLOCKED ANALOG-TO-DIGITAL CONVERSION FOR A DIGITAL POWER AMPLIFIER filed on Mar. 3, 2000, the entirety of which is incorporated herein by reference for all purposes.

BACKGROUND OF THE INVENTION

The present invention relates to noise-shaping digital amplifiers, and specifically to techniques for using and generating multiple and independent clocks in such amplifiers. It should be noted at the outset that although the invention is described herein with reference to a bandpass (e.g., RF) implementation, the present invention is also applicable to other amplifier configurations such as, for example, baseband audio amplifiers and motor drive circuits.

FIG. 1 shows an RF bandpass noise-shaping amplifier 100 designed according to techniques described in U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. RF amplifier 100 includes a frequency selective network 102 which, using continuous-time feedback, noise shapes the modulated RF input. Network 102 comprises at least one resonator stage having a transfer function designed to pass a band centered around 900 MHz.

A/D converter 104 converts the noise shaped RF signal to digital data using a sampling frequency fs which, in this example, is 3.6 GHz. A/D converter 104 may comprise a comparator.

Gate drive circuitry 106 takes the pulse train from A/D converter 104 and generates gate drive for each of FETs 108 and 110 of the power output stage of amplifier 100. The output power stage shown includes three inductors L1, L2 and L3, and capacitor C1. This configuration creates two separate resonances at nodes A and B respectively when the corresponding one of FETs 108 and 110 is off.

The continuous-time feedback to frequency selective network 102 is provided via feedback path 112. The output signal of the power stage is passed to a matching network 114 which passes the output RF signal to antenna 116 for transmission.

As will be understood, the amplifier configuration of FIG. 1 allows for two quantization states. With two quantization states there is a high number of signal transitions resulting in high drive losses. Therefore, it is desirable to provide techniques by which such losses may be mitigated or eliminated.

SUMMARY OF THE INVENTION

According to the present invention, an amplifier architecture is provided in which multi-level switching is enabled. That is, the amplifier architecture described herein exhibits more than two quantization states. This is achieved, in part, with parallel signal paths each of which has its own sampling circuitry. The multiple quantization states includes a state in which there is no signal output, thereby avoiding the undesirable switching losses described above. According to a specific embodiment, the clock signals for the different sampling circuits are independently developed resulting in a variety of other advantages.

Thus, the present invention provides an electronic device which includes at least two sampling circuits, and at least two switching stages configured in parallel. Each of the switching stages is coupled to one of the sampling circuits. The sampling circuits and the switching stages enable the electronic device to exhibit more than two quantization states. The electronic device further includes clock generation circuitry for generating independent clock signals for each of the sampling circuits.

A further understanding of the nature and advantages of the present invention may be realized by reference to the remaining portions of the specification and the drawings.

DETAILED DESCRIPTION OF SPECIFIC EMBODIMENTS

Figure 1:
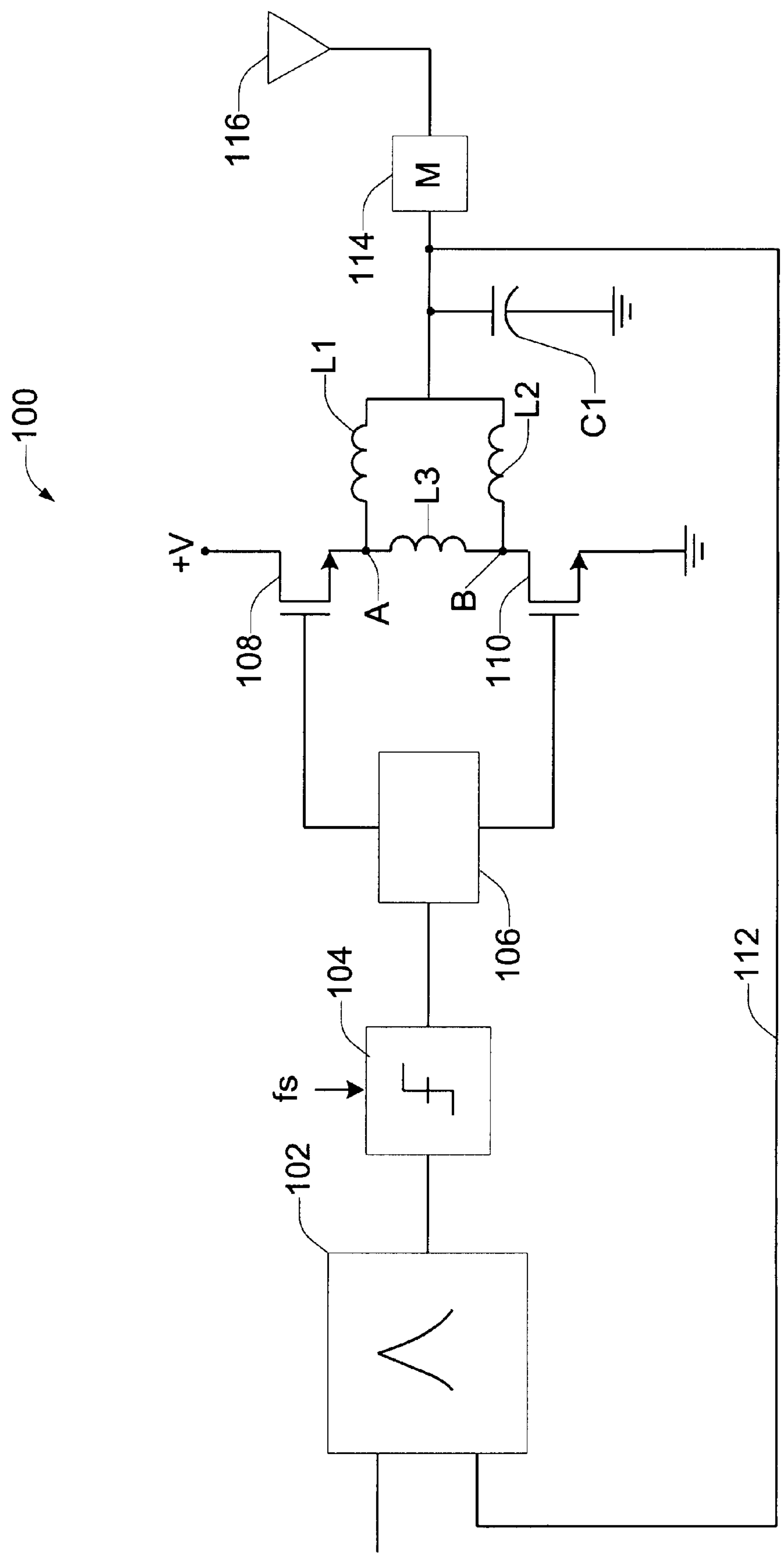
FIG. 1 is a simplified schematic of a first amplifier configuration.
Figure 2:
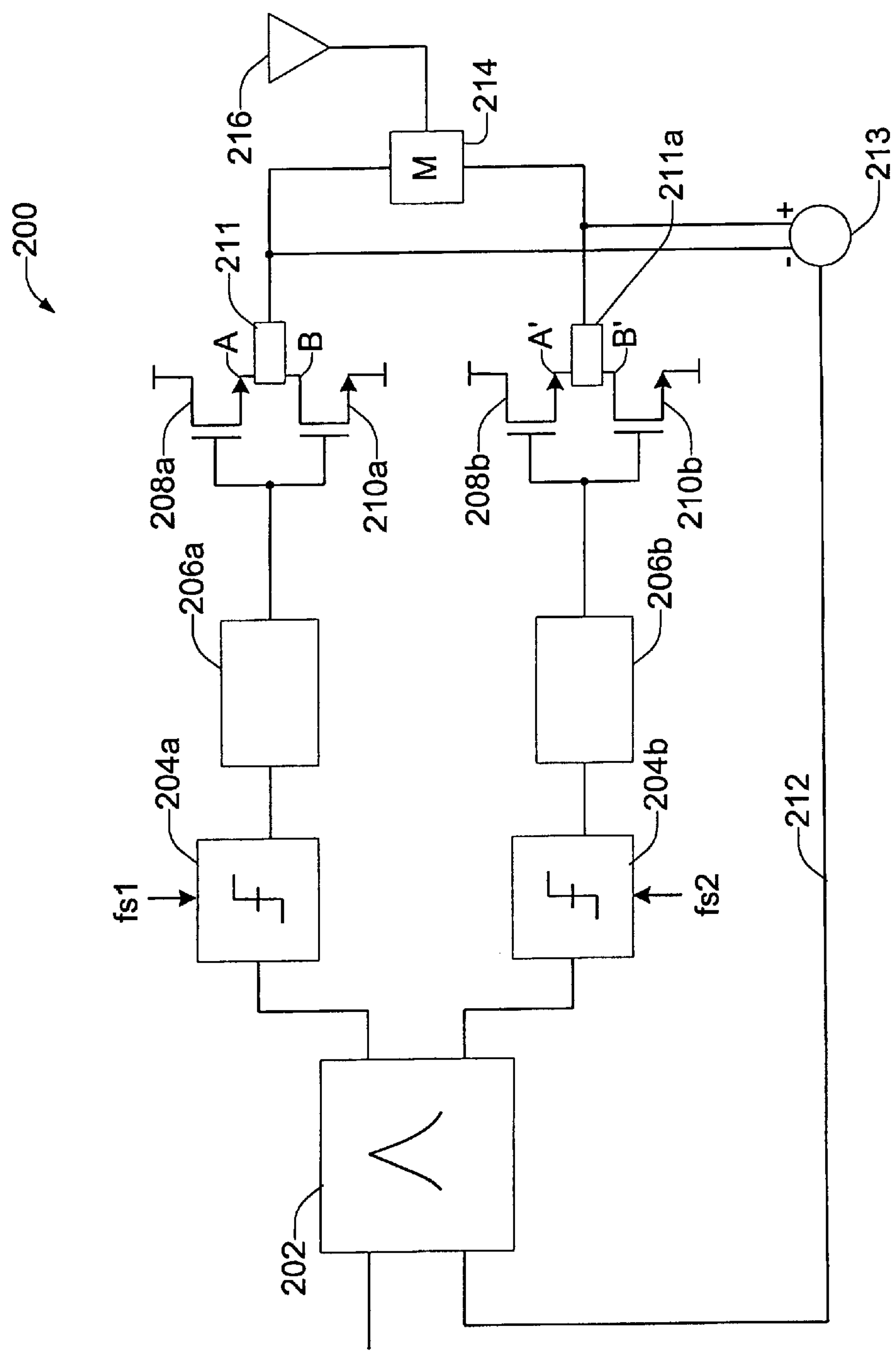
FIG. 2 is a simplified schematic of a second amplifier configuration for use with the present invention.

FIG. 2 shows an RF bandpass noise-shaping amplifier 200 designed according to the present invention as well as techniques described in U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. RF amplifier 200 includes a frequency selective network 202 which, using continuous-time feedback, noise shapes the modulated RF input. According to a specific embodiment, network 202 comprises at least one resonator stage having a transfer function designed to pass a band centered around 900 MHz.

Two A/D converters 204*a* and 204*b* convert the noise shaped RF signal to digital data using independently generated clock signals at a nominal sampling frequency fs (i.e., fsl and fs2) which, according to a specific embodiment, is 3.6 GHz. According to one embodiment, A/D converters 204*a* and 204*b* comprise two comparators configured to implement three-level switching.

Gate drive circuits 206*a* and 206*b* take the pulse trains from A/D converters 204*a* and 204*b*, respectively, and generate gate drive for their pair of transistors, i.e., FETs 208*a* and 210*a* or FETs 208*b* and 210*b*. Each pair of transistors has two separate resonances due to resonator circuits 211 and 211*a* respectively. That is, the power stage comprising FETs 208 and 210 has separate resonances at nodes A and B, while the stage comprising FETs 208*a* and 210*a* has separate resonances at nodes A' and B'.

Continuous-time feedback is provided to frequency selective network 202 via feedback path 212 and adder 213. The output signals of the power stages are passed to a matching network 214 which passes the output RF signal to antenna 216 for transmission. As will be understood, adder 213 may be implemented by tapping into matching network 214 once the signals are combined.

Having two comparators for A/D converters 204*a* and 204*b* allows the digital data to have three quantization states, i.e., three-level switching, rather than two. As mentioned above, with two quantization states there is a high number of signal transitions resulting in high drive losses. By contrast, with three states a "0" state can be selected when there is no signal output to avoid such undesirable switching losses.

The clocks for the respective comparators 204*a* and 204*b* may be generated from independent sources. According to a specific embodiment of the invention, the clocks for A/D converters 204*a* and 204*b* (i.e., fsl and fs2) are generated from at least some of the resonances at nodes A, B, A' and B'. According to a more specific embodiment, fs1 is provided in part by the resonance at node A and in part by the resonance at node B, while fs2 is provided in part by the resonance at node A' and in part by the resonance at node B'.

Figure 3:
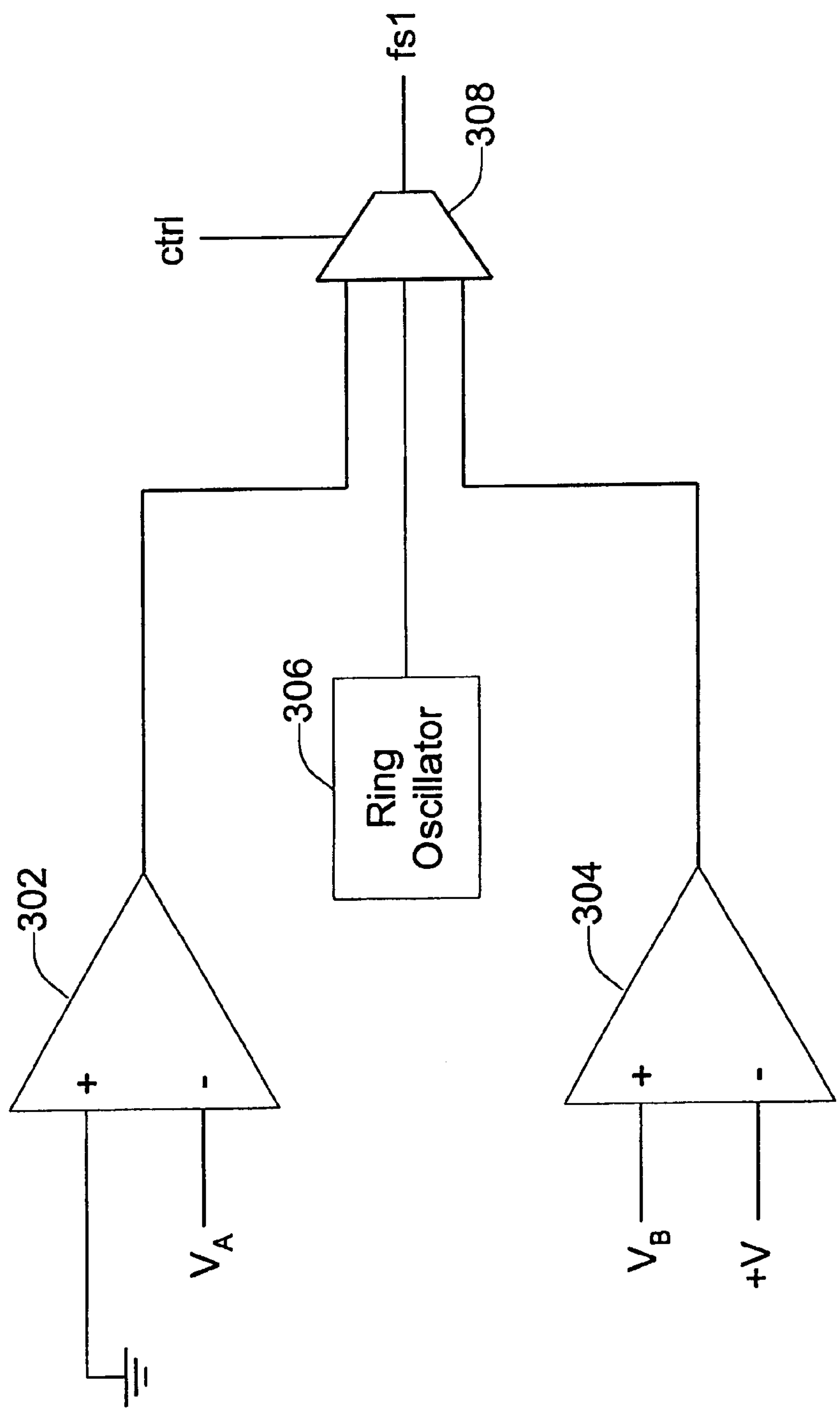
FIG. 3 shows clock generation circuitry designed according to a specific embodiment of the present invention.

The schematic of FIG. 3 shows one implementation by which this may be accomplished. Only generation of fs1 will be described. It will be understood, however that fs2 may be generated in much the same way. A comparator 302 compares the voltage at node A (i.e., $V_A$) to a reference voltage less than the positive supply of the power output stage, preferably ground. When node A resonates above and below this reference at 3.6 GHz, a 3.6 GHz clock is generated. Likewise a comparator 304 compares the voltage at node B (i.e., $V_B$) to a reference voltage greater than ground (or the negative rail), preferably the positive supply, thereby generating a 3.6 GHz clock when node B resonates. Multiplexer 308 selects between its inputs in response to a control signal generated by control logic (not shown), thereby generating the clock signal fs1. When the circuit is first turned on, the clock signal may be started by generation of a pulse which gets one of the resonances going.

One advantageous consequence of this clock generation technique is that, because the clock is generated at least in part from the resonances at nodes A and B, when these resonances move around (e.g., due to reflections and process variations), the clock to the corresponding comparator also moves around in a corresponding manner. That is, the gate edges generated by A/D converter 204*a* and gate drive circuitry 206*a* more closely match the timing of the output stage resonances than if an independently generated A/D clock were used.

Moreover, the pattern dependent jitter on the A/D converter clock due to the manner in which the resonances move around effectively scrambles the sample rate and "smears" sampling frequency dependent tones into white noise, thereby eliminating undesirable harmonics about the sampling frequency in the output power spectrum. In fact, according to the present invention, "dithering" of the A/D converter clock may be intentionally introduced in a controlled manner irrespective of how the clock was generated (e.g. independent vs. self-timed) to smear the noise tones dependent on the sampling frequency.

Referring back to FIG. 3 and according to a more specific embodiment of the invention, a ring oscillator 306 may also be included in the clock generation circuitry as an additional source of the clock signal. This may be desirable because the damping resistance associated with the output resonant circuits could be high enough to cause the resonances to decay sufficiently such that the oscillations no longer trip comparators 302 and 304 and the clock (and therefore the gate signal) locks up. Therefore, after some number of pulses generated from one of the resonance nodes (which may be determined from the damping resistance associated with the resonant circuits of the output stage) multiplexer 308 is controlled to select the input from the ring oscillator as the clock signal until the resonance on the other node begins. According to a specific embodiment, the ring oscillator starts and stops synchronously with the resonance oscillations so that the handoffs between clock sources are smooth. The ring oscillator may also be used at start up time.

In addition to the randomization of switching frequency dependent noise, there are additional noise benefits due to the independent nature of the two clocks. This is related to the fact that the average clock frequencies fs1 and fs2 typically differ by some relatively constant amount which is, in essence, the smallest repetitive sample rate experienced by the amplifier. That is, the difference between fs1 and fs2 results in an "effective" sample frequency which is much higher than either fs1 or fs2. As a result, any undesirable tones or "radiators" in the output noise spectrum which depend on the sample frequency are moved way out of the band of interest due to this very high "effective" sample frequency.

The schematic of FIG. 3 shows one implementation by which generation of fs1 and fs2 may be accomplished. It will be understood, however that there are other ways in which these clock signals may be generated.

According to a specific embodiment, the difference between fs1 and fs2 is intentionally introduced and controlled to derive the benefit of this effect. According to a more specific embodiment in which the clocks fs1 and fs2 are generated from stable independent sources other than the resonance nodes, the difference between fs1 and fs2 is controlled to derive this benefit. Even where fs1 and fs2 are derived from a single source, the difference may be introduced to derive the benefit and still remain within the scope of the invention.

While the invention has been particularly shown and described with reference to specific embodiments thereof, it will be understood by those skilled in the art that changes in the form and details of the disclosed embodiments may be made without departing from the spirit or scope of the invention. Therefore, the scope of the invention should be determined with reference to the appended claims.

What is claimed is:

1. An electronic device comprising at least two sampling circuits configured in separate parallel signal paths, and at least two switching stages each being configured in one of the parallel signal paths and coupled to a corresponding one of the sampling circuits therein, the sampling circuits and the switching stages enabling the electronic device to exhibit more than two quantization states, the electronic device further comprising clock generation circuitry for generating independent clock signals for each of the sampling circuits.

2. The electronic device of claim 1 wherein the at least two sampling circuits comprise first and second sampling circuits and the at least two switching stages comprise first and second switching stages corresponding to the first and second sampling circuits, respectively, the first and second sampling circuits and the first and second switching stages enabling the electronic device to exhibit 3 quantization states.

3. The electronic device of claim 1 wherein each switching stage has at least one resonance oscillation associated therewith, the clock generation circuitry generating the independent clock signals at least in part from the at least one resonance oscillation associated with a corresponding switching stage.

4. The electronic device of claim 3 wherein the at least one resonance oscillation for each switching stage comprises first and second resonance oscillations, each independent clock signal being generated by the clock generation circuitry at least in part from corresponding first and second resonance oscillations.

5. The electronic device of claim 4 further comprising a ring oscillator corresponding to each independent clock signal, each ring oscillator having a ring oscillation associated therewith, each independent clock signal being generated by the clock generation circuitry from the corresponding first and second resonance oscillations and the corresponding ring oscillation.

6. The electronic device of claim 5 further comprising multiplexing circuitry corresponding to each independent clock signal for selecting among first, second and third clock signal options corresponding to the first and second resonance oscillations and the ring oscillation, respectively.

7. The electronic device of claim 6 wherein the multiplexing circuitry for each independent clock signal is configured to select the third signal option after selection of either of the first and second signal options.

8. The electronic device of claim 7 wherein selection of the third signal option after selection of the first and second signal options occurs following a predetermined number of periods of the first and second resonance oscillations, respectively.

9. The electronic device of claim 7 wherein each ring oscillation starts and stops synchronously with either of the corresponding first and second resonance oscillations.

10. The electronic device of claim 5 wherein the ring oscillation is employed when the electronic device is initially powered up to start the at least one of the first and second resonance oscillations.

11. The electronic device of claim 4 further comprising multiplexing circuitry corresponding to each independent clock signal for selecting among at least first and second clock signal options corresponding to the first and second resonance oscillations, respectively.

12. The electronic device of claim 3 wherein each switching stage has first and second supply voltages associated therewith, the clock generation circuitry including at least one comparison circuit corresponding to each independent clock signal for comparing the at least one resonance oscillation associated with the corresponding switching stage to the corresponding supply voltages, the independent clock signal being generated at least in part therefrom.

13. The electronic device of claim 3 further comprising resonance circuitry associated with each switching stage, the resonance circuitry comprising at least one inductor and at least one capacitor, the at least one resonance oscillation for each switching stage being dependent thereon.

14. The electronic device of claim 3 further comprising dithering circuitry for dithering each independent clock signal before application to the corresponding sampling circuit.

15. The electronic device of claim 1 wherein the sampling circuits and the switching stages are configured for base band operation.

16. The electronic device of claim 15 wherein the base band frequency range comprises the audio band.

17. The electronic device of claim 1 wherein the sampling circuits and the switching stages are configured for band pass operation.

18. The electronic device of claim 17 wherein the band pass frequency range comprises the radio frequency band.

19. The electronic device of claim 1 wherein the electronic device comprises an audio amplifier.

20. The electronic device of claim 1 wherein the electronic device comprises a wireless communication device.

21. The electronic device of claim 1 wherein the electronic device comprises a line driver for a digital subscriber line.

22. The electronic device of claim 1 wherein the electronic device comprises a motor driver.

23. The electronic device of claim 2 wherein the electronic device comprises an oversampled, noise-shaping, mixed-signal processor, comprising:

at least one resonator stage in a feedback loop, the at least one resonator stage having an input;

the first and second sampling circuits in the feedback loop coupled to the at least one resonator stage, the first and second sampling circuits for sampling at least one analog signal at first and second sample frequency only at discrete time intervals;

the first and second switching stages in the feedback loop coupled to the first and second sampling circuits, each switching stage having an input and an output; and at least one continuous-time feedback path from the outputs of the switching stages to the input of the at least one resonator stage;

wherein the first and second sample frequencies corresponds to the independent clock signals.

24. In an electronic device comprising at least two sampling circuits, and at least two switching stages configured in parallel, each of the switching stages being coupled to one of the sampling circuits, the sampling circuits and the switching stages enabling the electronic device to exhibit more than two quantization states, a method for generating independent clock signals for each of the sampling circuits, comprising controlling a difference between frequencies associated with the independent clock signals.

* * * * *